United States Patent
Lee

(10) Patent No.: US 9,203,389 B2
(45) Date of Patent: Dec. 1, 2015

(54) MAJORITY DETERMINATION CIRCUIT, MAJORITY DETERMINATION METHOD, AND SEMICONDUCTOR DEVICE

(71) Applicant: SK hynix Inc., Gyeonggi-do (KR)

(72) Inventor: Yong-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 184 days.

(21) Appl. No.: 14/106,825

(22) Filed: Dec. 15, 2013

(65) Prior Publication Data
US 2014/0359402 A1 Dec. 4, 2014

(30) Foreign Application Priority Data

May 28, 2013 (KR) ........................ 10-2013-0060500

(51) Int. Cl.
*G06F 11/08* (2006.01)
*H03K 5/19* (2006.01)

(52) U.S. Cl.
CPC ........................................ *H03K 5/19* (2013.01)

(58) Field of Classification Search
CPC .............. H04L 5/026; H04L 25/03343; H04L 27/2627; H04L 27/2614; H04L 27/2003; H04L 25/068; H04L 1/08; G06F 11/1048; G06F 11/183; G06F 7/05; H03M 13/43; H03M 7/30; G11C 7/062; G11C 17/16; G11C 17/18; G11C 29/02; G11C 29/50; G11C 29/785; H03K 23/667
See application file for complete search history.

(56) References Cited

U.S. PATENT DOCUMENTS

2006/0061382 A1    3/2006    Ye et al.

FOREIGN PATENT DOCUMENTS

| KR | 100827663 | 5/2008 |
|---|---|---|
| KR | 1020130051070 | 5/2013 |

*Primary Examiner* — Guerrier Merant
(74) *Attorney, Agent, or Firm* — IP & T Group LLP

(57) ABSTRACT

A majority determination circuit includes a first determination unit suitable for determining a first majority between bits of a first logic value and a second logic value in a first odd-bit data, wherein the first odd-bit data is an even-bit data with absence of first bit, a second determination unit suitable for determining a second majority between bits of the first logic value and the second logic value in a second odd-bit data, wherein the second odd-bit data is the even-bit data with absence of second bit, and a result combination unit suitable for determining a third majority between bits of the first logic value and the second logic value in an even-bit data based on the first majority and the second majority.

18 Claims, 3 Drawing Sheets

MAJORITY DETERMINATION CIRCUIT, MAJORITY DETERMINATION METHOD, AND SEMICONDUCTOR DEVICE

CROSS-REFERENCE TO RELATED APPLICATIONS

The present application claims priority of Korean Patent Application No. 10-2013-0060500, filed on May 28, 2013, which is incorporated herein by reference in its entirety.

BACKGROUND

1. Field

Exemplary embodiments of the present invention relate to a majority determination circuit, a majority determination method, and a semiconductor device for reducing error when determining a majority.

2. Description of the Related Art

Data processing speed influences the performance of a semiconductor integrated circuit, for example, a main memory or a graphic memory for storing data in response to the control of a central processing unit (CPU) or a graphic processing unit (GPU).

Data bus inversion (DBI) is a technique for increasing data processing speed. According to DBI, for example, data is inverted and transmitted if four or more bits of eight bits of data are at a high level or a low level whereas data is transmitted without inversion if it is not. Thus, DM minimizes the number of switching times of output data and increases data processing speed.

In order to perform the DBI, a majority determination circuit is required for comparing the number of high-level bits with the number of low-level bits in data transmitted through a data bus and determining which level of bits is a majority.

FIG. 1 is a circuit diagram illustrating a conventional majority determination circuit.

As shown in FIG. 1, the majority determination circuit includes a plurality of first NMOS transistors N0 to N7 configured to be turned on/off in response to each bit D<0> to D<7> of data D<0:7> a plurality of second NMOS transistors N8 to N15 configured to be turned on/off in response to each bit DB<0> to DB<7> of inverted data DB<0:7> obtained by inverting data D<0:7>, PMOS transistors P0 and P1, dummy transistors DN0 and DN1 and a current source IS.

The majority determination circuit will be described with reference to FIG. 1.

Each of the plurality of first NMOS transistors N0 to N7 is coupled to a first node NO1, wherein each of the first NMOS transistors N0 to N7 is turned on to sink current flowing through the first node NO1 when a bit corresponding to itself is at a high level, and is turned off when the corresponding bit is at a low level. Each of the plurality of second NMOS transistors N8 to N15 is coupled to a second node NO2, wherein each of the second NMOS transistors is turned on to sink current from the second node NO2 when a bit corresponding to itself is at a high level, and is turned off when the corresponding bit is at a low level.

The first PMOS transistor P0 is connected between a power supply voltage VDD and the first node NO1 and sources current flowing through the first node NO1 in response to the voltage of the first node NO1. The second PMOS transistor is connected between the power supply voltage VDD and the second node NO2 and sources current flowing through the second node NO2 in response to the voltage of the first node NO1.

The first dummy transistor DN0 is coupled to the first node NO1 and has a gate to which a base voltage VSS is applied, thereby being in a turned-off state. The second dummy transistor DN1 is coupled to the second node NO2, and has a gate to which a power supply voltage VDD is applied, thereby being in a turned-on state. The second dummy transistor DN1 sinks current flowing through the second node NO2. Current sunk by each NMS transistor of the plurality of transistors N0 to N15 is equal to each other and the amount of current sunk by one dummy transistor is less than the amount of current sunk by the plurality of transistors N0 to N15.

A voltage of the second node NO2 corresponds to a majority determination result of the majority determination circuit. When, among the respective bits of data D<0:7>, the number of high-level bits is greater than the number of low-level bits, the number of turned-on transistors among the plurality of first transistors N0 to N7 is greater than the number of turned-on transistors among the plurality of second transistors N8 to N15. Accordingly, the amount of current sunk from the first node NO1 is greater than the amount of current sunk from the second node NO2, and thus a voltage corresponding to a high level is outputted to the second node NO2. When, among the respective bits of data D<0:7>, the number of low-level bits is greater than the number of high-level bits, the number of turned-on transistors among the plurality of second transistors N8 to N15 is greater than the number of turned-on transistors among the plurality of first transistors N0 to N7. Accordingly, the amount of current sunk from the first node NO1 is less than the amount of current sunk from the second node NO2, and thus a voltage corresponding to a low level is outputted to the second node NO2.

When, among the respective bits of data D<0:7> the number of high-level bits is equal to the number of low-level bits, the amount of current sunk by the plurality of first transistors N0 to N7 is equal to the amount of current sunk by the plurality of second transistors N8 to N15, but the amount of current sunk from the second node NO2 is relatively greater due to the dummy transistors DN0 and DN1, so that a voltage corresponding to a low level is outputted to the second node NO2. That is to say, a weight is given by dummy transistors, so that it is possible to output a specific logic value to the second node NO2 even when, among the respective bits of data D<0:7>, the number of high-level bits is equal to the number of low-level bits.

However, although a weight is applied using a dummy transistor, a distortion of data due to noise or the like, or a concern in impedance matching with an external device may cause error in data determination.

SUMMARY

Various embodiments are directed to provide a majority determination circuit, a majority determination method, and a semiconductor device which may determine a majority without a dummy transistor.

In an embodiment, a majority determination circuit may include a first determination unit suitable for determining a first majority between bits of a first logic value and a second logic value in a first odd-bit data, wherein the first odd-bit data is an even-bit data with absence of first bit, a second determination unit suitable for determining a second majority between bits of the first logic value and the second logic value in a second odd-bit data, wherein the second odd-bit data is the even-bit data with absence of second bit, and a result combination unit suitable for determining a third majority between bits of the first logic value and the second logic value in an even-bit data based on the first majority and the second majority.

In an embodiment, a majority determination method may include determining a first majority between bits of a first logic value and a second logic value in a first odd-bit data, wherein the first odd-bit data is an even-bit data with absence of first bit, determining a second majority between bits of the first logic value and the second logic value in a second odd-bit data, wherein the second odd-bit data is the even-bit data with absence of second bit, and determining a third majority between bits of the first logic value and the second logic value in an even-bit data based on the first majority and the second majority.

In an embodiment, a semiconductor device may include a plurality of first data lines, a plurality of second data lines, a majority determination unit suitable for combining a first majority between bits of a first logic value and a second logic value in a first odd-bit data with a second majority between bits of the first logic value and the second logic value in a second odd-bit data and for determining a third majority between bits of the first logic value and the second logic value in an even-bit data based on the first majority and the second majority, and a data transmission unit suitable for transmitting the even-bit data transmitted through the plurality of first data lines to the plurality of second data lines after selectively inverting the even-bit data based on the third majority, wherein the first odd-bit data is the even-bit data with absence of the first bit, and the second odd-bit data is the even-bit data with absence of the second bit.

In an embodiment, a majority determination circuit can include: first to $N^{th}$ determination units suitable for determining a corresponding majority among from a first to $N^{th}$ majority between bits of a first logic value and a second logic value in a corresponding odd-bit data among from a first odd-bit data to $N^{th}$ odd-bit data, a result combination unit suitable for determining a final majority between bits of the first logic value and the second logic value in an even-bit data based on the first to $N^{th}$ majority, wherein each of the first to $N^{th}$ odd-bit data is even-bit data with absence each of first to $N^{th}$ bit.

DETAILED DESCRIPTION

Figure 1:
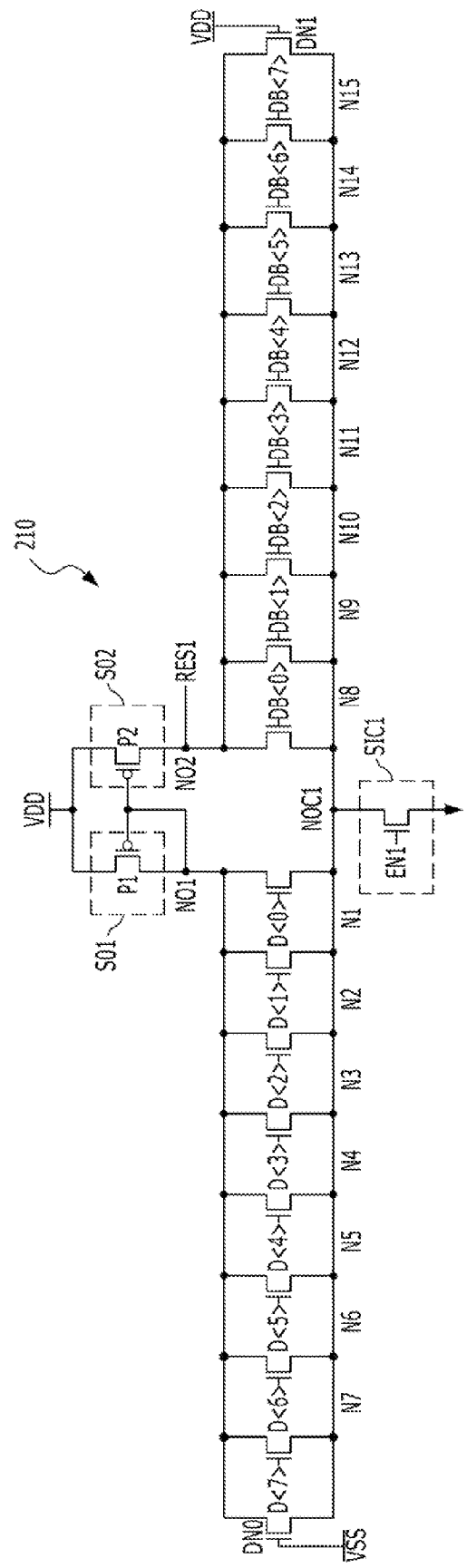
FIG. 1 is a circuit diagram illustrating a conventional majority determination circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereinafter, even-bit data represents multi-bit data having an even number of bits, and odd-bit data represent multi-bit data having an odd number of bits.

Figure 2:
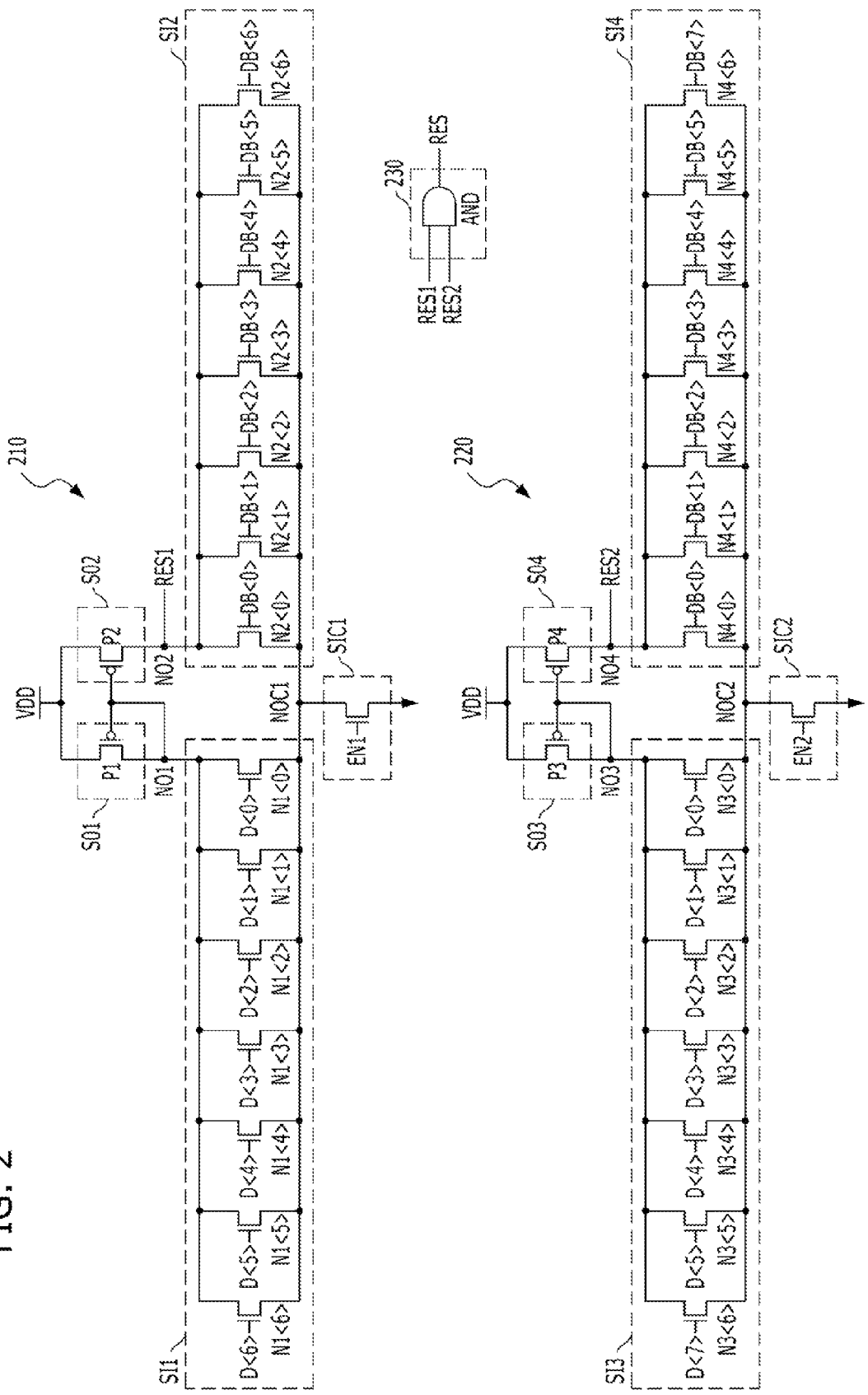
FIG. 2 is a circuit diagram illustrating a majority determination circuit according to an embodiment of the present invention.

FIG. 2 is a circuit diagram illustrating a majority determination circuit according to an embodiment of the present invention.

As shown in FIG. 2, the majority determination circuit may include a first determination unit 210 configured to determine majority between the bits of a first logic value and a second logic value in multiple bits D<0> to D<7> of even-bit data D<0:7> except for a first bit, a second determination unit 220 configured to determine majority between the bits of the first logic value and the second logic value in the multiple bits D<0> to D<7> of the even-bit data D<0:7> except for a second bit, and a result combination unit 230 configured to determine majority between the bits of the first logic value and the second logic value in the multiple bits D<0> to D<7> of the even-bit data D<0:7> based on a determination result of the first determination unit 210 and a determination result of the second determination unit 220.

The majority determination circuit will be described with reference to FIG. 2.

The number of bits of even-bit data may vary depending on designs. The following description will be given on an example where even-bit data is multi-bit data having eight bits for the convenience of explanation. In addition, the following description will be given on an example where a first bit is bit D<7> and a second bit is bit D<6>. That is to say, the first determination unit 210 receives bits D<0>-D<6> and determines a majority, and the second determination unit 220 receives bits D<0>-D<5> and D<7> and determines a majority. The first bit and the second bit may vary depending on designs, wherein it is enough that the first and the second bits are selected from bits D<0>-D<7> so that the second bit is different from the first bit. In addition, the following description will be given on the example where a first logic value is a high level, and a second logic value is a low level. The first logic value and the second logic value may vary.

The first determination unit 210 may determine majority between the bits of the first logic value and the second logic value in a first odd-bit data D<0:6>, which is obtained from the even-bit data D<0:7> and the first bit D<7>, in response to the first odd-bit data D<0:6> and first inverted odd-bit data DB<0:6>. Current flowing through the first determination unit 210 is determined according to the value of the first odd-bit data D<0:6>. The first determination unit 210 may output the first logic value when the first logic value is a majority and output the second logic value when the second logic value is a majority. For example, the first determination unit 210 may determine majority between the high-level bits and the low-level bits in the first odd-bit data D<0:6> and output a high-level signal, when high-level bits are a major part of the first odd-bit data D<0:6> and a low level signal when low-level bits are a major part of the first odd-bit data D<0:6>.

In order to perform the aforementioned operation, the first determination unit 210 may include a first current sourcing unit 501 for sourcing current flowing through a first node NO1 in response to the voltage of the first node NO1, a second current sourcing unit 502 for sourcing current flowing through a second node NO2 in response to the voltage of the first node NO1, a first current sinking unit SI1 for sinking current flowing through the first node NO1 by an amount determined by the first odd-bit data D<0:6>, a second current sinking unit SI2 for sinking current flowing through the second node NO2 by an amount determined by the first inverted odd-bit data DB<0:6> and a first common current sinking unit SIC1. The voltage of the second node NO2 corresponds to a determination result of the first determination unit 210.

The first current sinking unit SI1 may sink a greater amount of current flowing through the first node NO1 as the number of high-level bits among the multiple bits D<0>-D<6> of the first odd-bit data D<0:6> becomes greater. For such an operation, the first current sinking unit SI1 may include a plurality of third transistors N1<0:6>, each of which is coupled between the first node NO1 and a first common node NOC1 and is turned on/off in response to corresponding bit of the first odd-bit data D<0:6>. In FIG. 2, the third transistors N1<0>-N1<6> are turned on/off in response to bits D<0>-D<6>, respectively. As the number of high-level bits among the bits D<0>-D<6> becomes greater, the number of turned-on transistors among the third transistors N1<0>-N1<6> increases and thus the sunk amount of current flowing through the first node NO1 increases.

The second current sinking unit SI2 may sink a greater amount of current flowing through the second node NO2 as the number of high-level bits among the multiple bits DB<0>-DB<6> of the first inverted odd-bit data DB<0:6> becomes greater. For such an operation, the second current sinking unit SI2 may include a plurality of fourth transistors N2<0:6>, each of which is coupled between the second node NO2 and the first common node NOC1 and is turned on/off in response to each bit of the first inverted odd-bit data DB<0:6>. In FIG. 2, the fourth transistors N2<0>-N2<6> are turned on/off in response to bits DB<0>-DB<6>, respectively. As the number of high-level bits among the bits DB<0>-DB<6> becomes greater, the number of turned-on transistors among the fourth transistors N2<0>-N2<6> increases, and thus the sunk amount of current flowing through the second node NO2 increases.

The first current sourcing unit SO1 may include a first transistor P1, which is coupled between the first node NO1 and a power supply voltage VDD and is turned on/off in response to the voltage of the first node NO1. The second current sourcing unit SO2 may include a second transistor P2, which is coupled between the second node NO2 and the power supply voltage VDD and is turned on/off in response to the voltage of the first node NO1.

The first common current sinking unit SIC1 sinks current flowing through the first common node NOC1 when a first enable signal EN1 is activated. The first common current sinking unit SIC1 may include a transistor NC1, which is coupled between the first common node NOC1 and a base voltage VSS and is turned on/off in response to the first enable signal EN1. The first determination unit 210 performs a majority determination operation in response to the activated first enable signal EN1.

Since the first odd-bit data D<0:6> and the first inverted odd-bit data DB<0:6> are in an inverted relation from each other, a majority of bits of the first inverted odd-bit data DB<0:6> becomes a low level when a majority of bits of the first odd-bit data D<0:6> is at a high level and a majority of bits of the first inverted odd-bit data DB<0:6> becomes a high level when a majority of bits of the first odd-bit data D<0:6> is at a low level.

Therefore, when a majority of bits of the first odd-bit data D<0:6> is at a high level, the amount of current sunk by the first current sinking unit SI1 is greater than the amount of current sunk by the second current sinking unit SI2, and thus the voltage of the second node NO2 becomes high. When a majority of bits of the first odd-bit data D<0:6> is at a low level, the amount of current sunk by the second current sinking unit SI2 is greater than the amount of current sunk by the first current sinking unit SI1, and thus the voltage of the second node NO2 becomes low.

Since the odd-bit data does not have a case where the number of high-level bits is equal to the number of low-level bits, the voltage of the second node NO2 is either at logic high or at logic low at all times.

The second determination unit 220 may determine majority between the bits of the first logic value and the second logic value of a second odd-bit data D<0:5> and D<7>, which is obtained from the even-bit data D<0:7> and the second bit D<6> in response to the second odd-bit data D<0:5> and D<7> and second inverted odd-bit data DB<0:5> and DB<7>. Current flowing through the second determination unit 220 is determined according to the value of the second odd-bit data D<0:5> and D<7. The second determination unit 220 may output the first logic value when the first logic value is a majority, and output the second logic value when the second logic value is a majority. That is to say, the second determination unit 220 may determine majority between the high-level bits and the low-level bits in the second odd-bit data D<0:5> and D<7> and may output a high-level signal when high-level bits are a major part of the second odd-bit data D<0:5> and D<7> and may output a low level signal when low-level bits are a major part of the second odd-bit data D<0:5> and D<7>.

In order to perform the aforementioned operation, the second determination unit 220 may include a third current sourcing unit SO3 for sourcing current flowing through a third node NO3 in response to the voltage of the third node NO3, a fourth current sourcing unit SO4 for sourcing current flowing through a fourth node NO4 in response to the voltage of the third node NO3, a third current sinking unit SI3 for sinking current flowing through the third node NO3 by an amount determined by the second odd-bit data D<0:5> and D7, a fourth current sinking unit SI4 for sinking current flowing through the fourth node NO4 by an amount determined by the second inverted odd-bit data DB<0:5> and DB<7> and a second common current sinking unit SIC2. The voltage of the fourth node NO4 corresponds to a determination result of the second determination unit 220.

The third current sinking unit SI3 may sink a greater amount of current flowing through the third node NO3 as the number of high-level bits among the multiple bits D<0>-D<5> and D<7> of the second odd-bit data D<0:5> and D<7> becomes greater. For such an operation, the third current sinking unit SI3 may include a plurality of seventh transistors N3<0:6>, each of which is coupled between the third node NO3 and a second common node NOC2 and is turned on/off in response to corresponding bits of the second odd-bit data D<0:5> and D<7>. In FIG. 2, transistors N3<0>-N3<6> are turned on/off in response to bits D<0>-D<5> and D<7> respectively. As the number of high-level bits among the bits D<0>-D<5> and D<7> becomes greater, the number of turned-on transistors among the seventh transistors N3<0>-N3<6> increases, and thus the amount of current sunk that flows through the third node NO3 increases.

The fourth current sinking unit SI4 may sink a greater amount of current flowing through the fourth node NO4 as the number of high-level bits among the multiple bits DB<0>-DB<5> and DB<7> of the second inverted odd-bit data DB<0:5> and DB<7> becomes greater. For such an operation, the fourth current sinking unit SI4 may include a plurality of eighth transistors N4<0:6>, each of which is coupled between the fourth node NO4 and the second common node NOC2 and is turned on/off in response to each bit of the second inverted odd-bit data DB<0:5> and DB<7>. In FIG. 2, the eighth transistors N4<0>-N4<6> are turned on/off in response to bits DB<0>-DB<5> and DB<7>, respectively. As the number of high-level bits among the bits DB<0>-DB<5> and DB<7> becomes greater, the number of turned-on transistors among the eighth transistors N4<0>-N4<6> increases, and thus the amount of current sunk that flows through the fourth node NO4 increases.

The third current sourcing unit SO3 may include a fifth transistor P3, which is coupled between the third node NO3 and the power supply voltage VDD and is turned on/off in response to the voltage of the third node NO3. The fourth current sourcing unit SO4 may include a sixth transistor P4, which is coupled between the fourth node NO4 and the power supply voltage VDD and is turned on/off in response to the voltage of the third node NO3.

The second common current sinking unit SIC2 sinks current flowing through the second common node NOC2 when a second enable signal EN2 is activated. The second common current sinking unit SIC2 may include a transistor NC2, which is coupled between the second common node NOC2 and the base voltage VSS and is turned on/off in response to the second enable signal EN2. The second determination unit 220 performs a majority determination operation in response to the activated second enable signal EN2.

Since the second odd-bit data D<0:5> and D<7> and the second inverted odd-bit data DB<0:5> and DB<7> are in an inverted relationship from each other, a majority of bits of the second inverted odd-bit data DB<0:5> and DB<7> becomes a low level when a majority of bits of the second odd-bit data D<0:5> and D<7> is at a high level, and a majority of bits of the second inverted odd-bit data DB<0:5> and DB<7> becomes a high level when a majority of bits of the second odd-bit data D<0:5> and D<7> is at a low level.

Therefore, when a majority of bits of the second odd-bit data D<0:5> and D<7> is at a high level, the amount of current sunk by the third current sinking unit SI3 is greater than the amount of current sunk by the fourth current sinking unit SI4, and thus the voltage of the fourth node NO4 becomes high. When a majority of bits of the second odd-bit data D<0:5> and D<7> is at a low level, the amount of current sunk by the fourth current sinking unit SI4 is greater than the amount of current sunk by the third current sinking unit SI3, and thus the voltage of the fourth node NO4 becomes low.

Since the odd-bit data does not have a case where the number of high-level bits is equal to the number of low-level bits, the voltage of the fourth node NO4 is either at logic high or at logic low at all times.

The result combination unit 230 may determine that a first logic value is a majority when the determination results of the first determination unit 210 and the second determination unit 220 are that the first logic value is a majority and determines that a second logic value is a majority when the determination results of the first determination unit 210 and the second determination unit 220 are that the second logic value is a majority. When the determination results of the first determination unit 210 and second determination unit 220 are different from each other, the result combination unit 230 may output preset one from the first logic value and second logic value. The determination results of the first determination unit 210 and second determination unit 220 are different from each other when the number of high-level bits and the number of low-level bits are equal to each other and the logic values of the first bit D<7> and second bit D<6> are different from each other. In this case, the result combination unit 230 may output preset logic value of low or high.

The result combination unit 230 may include a logic gate for receiving the voltage of the second node NO2 and the voltage of the fourth node NO4 and for outputting the determination result. In an exemplary embodiment, when the result combination unit 230 is an AND gate, the result combination unit 230 may output a high-level signal if a high level is a majority in the even-bit data D<0:7> and may output a low-level signal if a low level is a majority in the even-bit data D<0:7> or if the number of high-level bits and the number of low-level bits are equal to each other.

According to the present invention, the majority determination circuit combines the majority determination results of the determination units, which determine a majority in odd-bit data, and then performs a final majority determination. Since each determination unit determines a majority in odd-bit data, there is no case where the number of high-level bits and the number of low-level bits are equal to each other. Thus, it is unnecessary to include a dummy transistor, and error caused by noise may be reduced. In addition, since the determination units perform determination operations with two different data bits D<0:6> and D<0:5> and D<7> obtained from the same input data D<0:7>, an accurate determination may be drawn although error occurs in a part of bits.

For example, it is assumed that the values of even-bit data D<0:7> are as follows, and bit D<3> has been inverted due to error. Table 1 is shown to explain the operation of the majority determination circuit in the case.

TABLE 1

|  | D<7> | D<6> | D<5> | D<4> | D<3> | D<2> | D<1> | D<0> | 1st Determination Unit | 2nd Determination Unit | Result Combination Unit |
|---|---|---|---|---|---|---|---|---|---|---|---|
| Normal | L | H | L | L | L | H | H | L | L | L | L |
| Noise | L | H | L | L | H | H | H | L | H | L | L |

When error occurs in bit D<3 the first determination unit 210 draws a wrong determination that is HIGH because making the determination except for bit D<7>, the second determination unit 220 draws an accurate determination that is LOW because making the determination except for bit D<6>, and the result combination unit 230 draws an accurate determination that is LOW by combining the two results.

Although FIG. 2 illustrates the case where the majority determination results of two determination units are combined to draw a final majority determination, the majority determination results of three or more determination units with three or more different data bits obtained from the same input data D<0:7> may be combined to draw a final majority determination, which may further raise the accuracy of majority determination.

Figure 3:
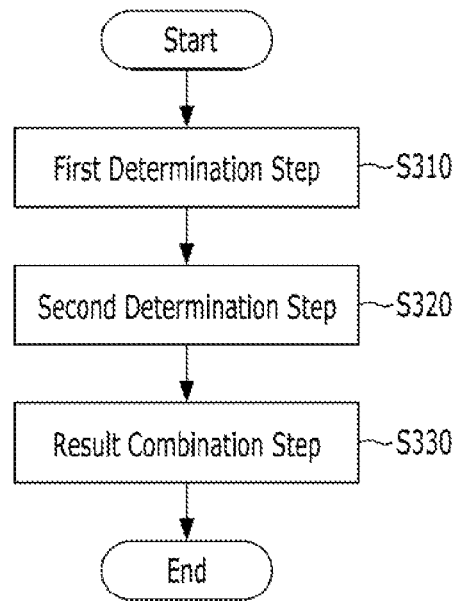
FIG. 3 is a flowchart illustrating a majority determination method according to an embodiment of the present invention.

FIG. 3 is a flowchart illustrating a majority determination method according to an embodiment of the present invention.

As shown in FIG. 3, the majority determination method may include a first determination step S310 for determining majority between the bits of the first logic value and the second logic value in the multiple bits D<0>-D<7> of even-bit data D<0:7> except for the first bit, a second determination step S320 for determining majority between the bits of the first logic value and the second logic value in the multiple bits D<0>-D<7> of the even-bit data D<0:7> except for the second bit, and a result combination step S330 for determining majority between the bits of the first logic value and the second logic value in the even-bit data D<0:7> in response to the determination result of the first determination step S310 and the determination result of the second determination step S320.

The majority determination method will be described with reference to FIGS. 2 and 3.

In the first determination step S310 majority is determined between the bits of the first logic value and the second logic value in the first odd-bit data excluding the first bit from the even-bit data in response to the first odd-bit data and first inverted odd-bit data obtained by inverting the first odd-bit data.

In the second determination step S320, majority is determined between the bits of the first logic value and the second logic value in the second odd-bit data excluding the second bit from the even-bit data in response to the second odd-bit data and second inverted odd-bit data obtained by inverting the second odd-bit data.

In the result combination step S330, it is determined that the first logic value is a majority when the determination results of the first determination step S310 and the second determination step S320 are that the first logic value is a majority, and it is determined that the second logic value is a majority when the determination results of the first determination step S310 and the second determination step S320 are that that the second logic value is a majority. When the determination result in the first determination step S310 and the determination result in the second determination step S320 are different from each other, a preset logic value from the first and second logic values may be outputted.

The first determination step S310 is performed by the first determination unit 210 shown in FIG. 2, the second determination step S320 is performed by the second determination unit 220 shown in FIG. 2, and the result combination step S330 is performed by the result combination unit 230 shown in FIG. 2. Each step is performed as described above with reference to FIG. 3. The first determination step S310 and the second determination step S320 may be performed in regular sequence or at the same time.

Figure 4:
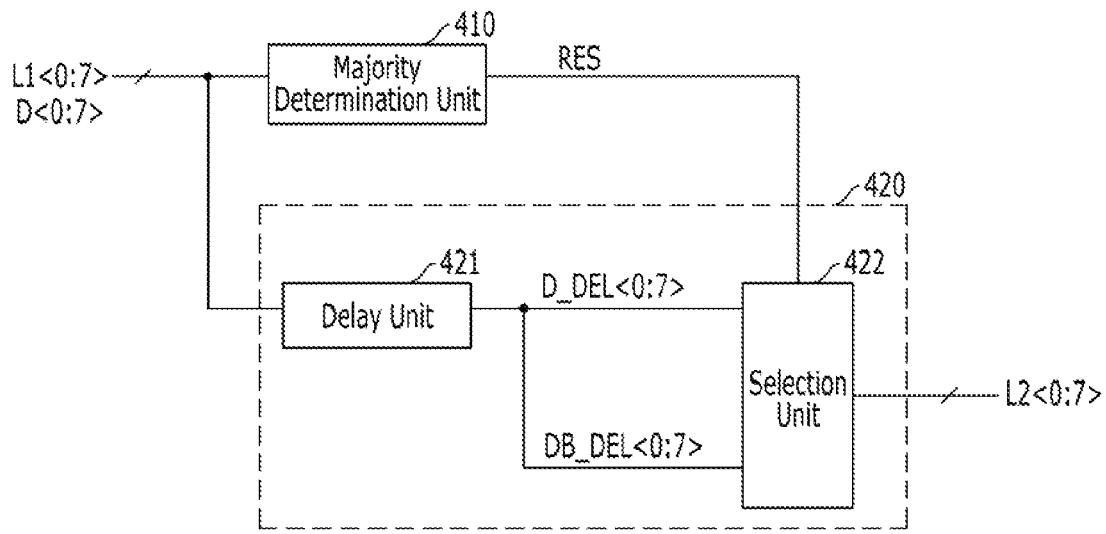
FIG. 4 is a block diagram illustrating a semiconductor device according to an embodiment of the present invention.

FIG. 4 is a block diagram illustrating a semiconductor device according to an embodiment of the present invention.

As illustrated in FIG. 4, the semiconductor device may include a plurality of first data lines L1<0:7>, a plurality of second data lines L2<0:7>, a majority determination unit 410 for combining a first determination result RES1 obtained by determining majority between the bits of the first logic value and the second logic value in the multiple bits D<0>-D<7> of even-bit data D<0:7> received through the plurality of first data lines L1<0:7> except for the first bit with a second determination result RES2 obtained by determining majority between the bits of the first logic value and the second logic value in the multiple bits D<0>-D<7> of the even-bit data D<0:7> except for the second bit and for determining majority between the bits or the first logic value and the second logic value in the multiple bits D<0>-D<7> of the even-bit data D<0:7 and a data transmission unit 420 for transmitting the even-hit data D<0:7> received through the first data lines L1<0:7> to the plurality of second data lines L2<0:7> after selectively inverting the even-bit data D<0:7> in response to the determination result. RES of the majority determination unit 410.

The semiconductor device will be described with reference to FIG. 4.

The semiconductor device may be a circuit for performing the aforementioned DBI. The semiconductor device inverts and transmits even-bit data D<0:7>, which is received through the plurality of first data lines L1<0:7> to the plurality of second data lines L2<0:7> when the data of a high or low level is a majority in the multiple bits D<0>-D<7> of the even-bit data D<0:7> and transmits the even-bit data D<0:7> without inversion, thereby minimizing the number of times of switching for output data and thus increasing a data processing speed. Here whether or not inversion is performed may vary depending on designs.

For example, in the case where it is designed that low-level hits are to be a majority in the second data lines L2<0:7>, even-hit data D<0:7> is transmitted without inversion when LOW is a majority in the even-bit data D<0:7>, and even-bit data D<0:7> is inverted and transmitted when HIGH is a majority therein. In contrast, in the case where it is designed that high-level bits are to be a majority in the second data lines L2<0:7>, even-bit data D<0:7> is transmitted without inversion when HIGH is a majority in the even-bit data D<0:7>, and even-bit data D<0:7> is inverted and transmitted when LOW is a majority therein. When the number of high-level bits and the number of low-level bits are equal to each other in even-bit data D<0:7>, the even-bit data D<0:7> may be inverted or may not be inverted before being transmitted.

The majority determination unit 410 may be the majority determination circuit described above with reference to FIGS. 2 and 3. The majority determination unit 410 may perform a majority determination and transmits the result of the determination to the data transmission unit 420, as described above with reference to FIGS. 2 and 3.

The data transmission unit 420 may selectively invert even-bit data D<0:7>, which is received through the plurality of first data lines L1<0:7>, depending on a majority determination result RES of the majority determination unit 410 and then output the selectively inverted even-bit data D<0:7> to the plurality of second data lines L2<0:7>. In this case, the even-bit data D<0:7> received through the first data lines L1<0:7> are delayed by a time period required for the majority determination unit 410 to perform a majority determination operation.

For such an operation, the data transmission unit 420 may include a delay unit 421 for delaying and outputting even-bit data D<0:7> of the plurality of first data lines L1<0:7> by a time period required for the majority determination unit 410 to perform a majority determination operation and a selection unit 422 for selecting one of an output D_DEL<0:7> of the delay unit 421 and an inverted output DB_DEL<0:7> obtained by inverting the output of the delay unit 421 in response to a determination result RES of the majority determination unit 410 and then transmitting the selected output to the plurality of second data lines L2<0:7>. In this case, the data of the plurality of first data lines L1<0:7> is delayed in order for data transmitted to the selection unit 422 through the plurality of first data lines L1<0:7> and a majority determination result of the data to reach the selection unit 422 at the same time.

The semiconductor device according to the present invention may perform an accurate DBI using the majority determination circuit shown in FIG. 2.

The exemplary embodiments of the present invention are provided to generate a final determination result by combining determination results obtained through two or more determination units, which determine a majority using odd-bit data, thereby enabling a majority determination.

Although various embodiments have been described for illustrative purposes, it will be apparent to those skilled in the art that various changes and modifications may be made without departing from the spirit and scope of the invention as defined in the following claims.

What is claimed is:

1. A majority determination circuit comprising:
   a first determination unit suitable for determining a first majority between bits of a first logic value and a second logic value in a first odd-bit data, wherein the first odd-bit data is an even-bit data with absence of a first bit;
   a second determination unit suitable for determining a second majority between bits of the first logic value and the second logic value in a second odd-bit data, wherein the second odd-bit data is the even-bit data with absence of a second bit;
   and a result combination unit suitable for determining a third majority between bits of the first logic value and the second logic value in the even-bit data based on the first majority and the second majority.

2. The circuit of claim 1, wherein the first determination unit determines the first majority in response to the first odd-bit data and inverted first odd-bit data, and
   wherein the second determination unit determines the second majority in response to the second odd-bit data and inverted second odd-bit data.

3. The circuit of claim 1, wherein the result combination unit determines that the first logic value is the third majority when the first majority and the second majority indicate the first logic value, and determines that the second logic value is the third majority when the first majority and the second majority indicate the second logic value.

4. The circuit of claim 3, wherein each of the first determination unit and the second determination unit outputs the first logic value when the first majority and the second majority indicate the first logic value, and outputs the second logic value when the first majority and the second majority indicate the second logic value, and
   wherein the result combination unit outputs preset one from the first and second logic values when the first majority and the second majority are different from each other.

5. The circuit of claim 2, wherein current flowing through the first determination unit depends on a value of the first odd-bit data, and current flowing through the second determination unit depends on a value of the second odd-bit data.

6. The circuit of claim 5, wherein the first determination unit comprises:
   a first current sourcing unit for sourcing a current flowing through a first node in response to a voltage of the first node;
   a second current sourcing unit for sourcing a current flowing through a second node in response to the voltage of the first node;
   a first current sinking unit for sinking the current flowing through the first node by an amount determined by the value of the first odd-bit data; and
   a second current sinking unit for sinking the current flowing through the second node by an amount determined by a value of the inverted first odd-bit data, and
   wherein the first majority corresponds to a voltage of the second node.

7. The circuit of claim 6, wherein the first current sourcing unit comprises a first transistor configured to be coupled between the first node and a power supply voltage and to be controlled by the voltage of the first node,
   the second current sourcing unit comprises a second transistor configured to be coupled between the second node and the power supply voltage and to be controlled by the voltage of the first node,
   the first current sinking unit comprises one or more third transistors configured to be coupled between the first node and a first common node and to be controlled by values of corresponding bits of the first odd-bit data, and
   the second current sinking unit comprises one or more fourth transistors configured to be coupled between the second node and the first common node and to be controlled by values of corresponding bits of the inverted first odd-bit data.

8. The circuit of claim 7, wherein the second determination unit comprises:
   a third current sourcing unit for sourcing a current flowing through a third node in response to a voltage of the third node;
   a fourth current sourcing unit for sourcing a current flowing through a fourth node in response to the voltage of the third node;
   a third current sinking unit for sinking the current flowing through the third node by an amount determined by the value of the second odd-bit data; and
   a fourth current sinking unit for sinking the current flowing through the fourth node by an amount determined by a value of the inverted second odd-bit data, and
   wherein the second majority corresponds to a voltage of the fourth node.

9. The circuit of claim 8, wherein the third current sourcing unit comprises a fifth transistor configured to be coupled between the third node and the power supply voltage and to be controlled by the voltage of the third node,
   the fourth current sourcing unit comprises a sixth transistor configured to be coupled between the fourth node and the power supply voltage and to be controlled by the voltage of the third node;
   the third current sinking unit comprises one or more seventh transistors configured to be coupled between the third node and a second common node and to be controlled by values of corresponding bits of the second odd-bit data; and
   the fourth current sinking unit comprises one or more eighth transistors configured to be coupled between the fourth node and the second common node and to be controlled by values of corresponding bits of the inverted second odd-bit data.

10. The circuit of claim 9, wherein the result combination unit comprises a logic gate for outputting a combination of the first majority and the second majority, wherein the combination corresponding to a determination result of the result combination unit.

11. A majority determination method comprising:
determining a first majority between bits of a first logic value and a second logic value in a first odd-bit data, wherein the first odd-bit data is an even-bit data with absence of a first bit;
determining a second majority between bits of the first logic value and the second logic value in a second odd-bit data, wherein the second odd-bit data is the even-bit data with absence of a second bit;
and determining a third majority between bits of the first logic value and the second logic value in the even-bit data based on the first majority and the second majority.

12. The method of claim 11, wherein determining the first majority determines the first majority in response to the first odd-bit data and inverted first odd-bit data, and
wherein determining the second majority determines the second majority in response to the second odd-bit data and inverted second odd-bit data.

13. The method of claim 11, wherein determining the third majority determines that the first logic value is the third majority when the first majority and the second majority indicate the first logic value and determines that the second logic value is the third majority when the first majority and the second majority indicate the second logic value.

14. The method of claim 13, wherein each of determining the first majority and determining the second majority outputs the first logic value when the first majority and the second majority indicate the first logic value and outputs the second logic value when the first majority and the second majority indicate the second logic value, and
wherein determining the third majority outputs preset one from the first and second logic values when the first majority and the second majority are different to each other.

15. A semiconductor device comprising:
a plurality of first data lines;
a plurality of second data lines;
a majority determination unit suitable for combining a first majority between bits of a first logic value and a second logic value in a first odd-bit data with a second majority between bits of the first logic value and the second logic value in a second odd-bit data and for determining a third majority between bits of the first logic value and the second logic value in an even-bit data based on the first majority and the second majority; and
a data transmission unit suitable for transmitting the even-bit data transmitted through the plurality of first data lines to the plurality of second data lines after selectively inverting the even-bit data based on the third majority,
wherein the first odd-bit data is the even-bit data with absence of the first bit, and the second odd-bit data is the even-bit data with absence of the second bit.

16. The device of claim 15, wherein the data transmission unit delays the even-bit data until the majority determination unit to determine the third majority.

17. The device of claim 16, wherein the majority determination unit comprises:
a first determination unit for determining the first majority;
a second determination unit for determining the second majority; and
a result combination unit for determining the third majority.

18. The device of claim 16, wherein the data transmission unit comprises:
a delay unit for delaying the even-bit data until the majority determination unit to determine the third majority; and
a selection unit for selecting one from an output and an inverted output of the delay unit in response to the third majority and transmitting an output of the selection unit to the plurality of second data lines.

* * * * *